United States Patent
Moon et al.

(10) Patent No.: US 7,418,684 B1
(45) Date of Patent: Aug. 26, 2008

(54) SYSTEMS, METHODS, AND APPARATUS TO PERFORM STATIC TIMING ANALYSIS AND OPTIMIZATION FOR MULTI-MODE CLOCK CIRCUIT NETWORKS

(75) Inventors: Cho W. Moon, San Diego, CA (US); Harish Kriplani, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/841,000

(22) Filed: May 7, 2004

(51) Int. Cl.
    *G06F 17/50* (2006.01)
(52) U.S. Cl. .............................. 716/6; 716/5
(58) Field of Classification Search ............ 716/4–6, 716/18; 703/19
    See application file for complete search history.

(56) References Cited

U.S. PATENT DOCUMENTS

| | | | | |
|---|---|---|---|---|
| 5,452,239 A | * | 9/1995 | Dai et al. ..................... | 703/19 |
| 5,650,938 A | * | 7/1997 | Bootehsaz et al. ............ | 716/6 |
| 5,778,216 A | * | 7/1998 | Venkatesh ................... | 713/503 |
| 5,946,475 A | * | 8/1999 | Burks et al. .................. | 716/6 |
| 6,301,553 B1 | * | 10/2001 | Burgun et al. ................ | 703/15 |
| 6,799,308 B2 | * | 9/2004 | You et al. .................... | 716/6 |
| 2002/0112213 A1 | * | 8/2002 | Abadir et al. ................. | 716/4 |
| 2003/0009731 A1 | * | 1/2003 | Wallace ....................... | 716/5 |
| 2004/0268279 A1 | * | 12/2004 | Oleksinski et al. ............ | 716/6 |

OTHER PUBLICATIONS

Bryant, Randal E., "Graph-Based Algorithms for Boolean Function Manipulation," IEEE Transactions on Computers, vol. C-35, No. 8, pp. 677-691, Aug. 1986.
Cherry, James J., Pearl: A CMOS Timing Analyzer, Design Automation Conference, pp. 148-159, 1998.

* cited by examiner

*Primary Examiner*—Paul Dinh
(74) *Attorney, Agent, or Firm*—Alford Law Group, Inc.; William E. Alford; Teresa Wong

(57) ABSTRACT

A method and an apparatus to perform static timing analysis and optimization for multi-mode clock circuit networks have been disclosed. In one embodiment, the method includes determining a plurality of sensitization conditions associated with one or more clock signals in a circuit network operable in a plurality of modes and automatically eliminating false paths from a plurality of clock paths of the circuit network based on the plurality of sensitization conditions. Other embodiments have been claimed and described.

44 Claims, 7 Drawing Sheets

Static Timing Analysis

Figure 2  Static Timing Analysis

US 7,418,684 B1

SYSTEMS, METHODS, AND APPARATUS TO PERFORM STATIC TIMING ANALYSIS AND OPTIMIZATION FOR MULTI-MODE CLOCK CIRCUIT NETWORKS

FIELD OF INVENTION

The present invention relates to electrical and/or electronic circuit designs, and more particularly, to electrical and/or electronic circuit design automation.

BACKGROUND

Multi-mode clock (MMC) circuit networks refer to circuit networks with multiple clocks for different modes of operation. In general, the modes of operation are mutually exclusive, and thus, all the clocks in a MMC circuit network cannot be active simultaneously. An example of a MMC circuit network is shown in FIG. 1. The circuit network 100 has two modes, namely, functional mode and test mode. In functional mode, the clock signal, func_clk, is active. Likewise, in test mode, the clock signal, test_clk, is active. The sequential elements (e.g., ff1 and ff2) in the circuit network 100 are clocked by a multiplexer (MUX) 110. The MUX 110 selects one of the inputs, func_clk and test_clk, in response to the mode signal, test_enable.

During timing analysis on the circuit network, if the value of the mode signal is not specified, one conventional timing analysis tool analyzes paths from func_clk to test_clk, and vice versa. For example, a setup violation may be reported at the D-input terminal of ff2 (i.e., ff2/D) due to a data signal launched by func_clk and a clock signal captured by test_clk. The corresponding clock path has func_clk going through ff1/CP, ff1/Q, and ff2/D sequentially (i.e., func_clk=>ff1/CP=>ff1/Q=>ff2/D) and the clock signal, test_clk going through ff2/CP (i.e., test_clk=>ff2/CP). Since func_clk and test_clk are mutually exclusive, the above violation is impossible in the corresponding circuit network in practice. Hence, the above clock path is referred to as a false path.

False paths that arise from mutually exclusive clocks are problematic in timing analysis and optimization flows because they may cause invalid alarms or error reports. One conventional approach to timing optimization is to perform multiple timing analysis runs during optimization for all possible modes of operation. A typical optimization tool cannot determine if the worst-case timing has been met unless the analysis has been done for all possible modes. Thus, this approach is unsatisfactory because of the increase in flow complexity.

A second conventional approach performs one timing analysis run during optimization while assuming all possible modes of operation. However, since some clock signals are mutually exclusive, there are one or more false paths when all modes of operation are assumed to be possible. To handle the false paths, circuit designers have to manually identify the false paths. Since this manual identification process is tedious and error-prone, the second approach is also undesirable.

SUMMARY

The present invention includes a method and an apparatus to perform static timing analysis and optimization for multi-mode clock circuit networks. In one embodiment, the method includes determining a plurality of sensitization conditions associated with one or more clock signals in a circuit network operable in a plurality of modes and automatically eliminating false paths from a plurality of clock paths of the circuit network based on the plurality of sensitization conditions.

Other features of the present invention will be apparent from the accompanying drawings and from the detailed description that follows.

BRIEF DESCRIPTION OF THE DRAWINGS

The present invention is illustrated by way of example and is not limited by the figures of the accompanying drawings.

DETAILED DESCRIPTION

A method and an apparatus to perform static timing analysis and optimization for multi-mode clock (MMC) circuit networks are described. In one embodiment, the method includes determining a number of sensitization conditions associated with one or more clock signals in a circuit network operable in a number of modes and automatically eliminating false paths from a number of clock paths of the circuit network based on the sensitization conditions.

In the following description, numerous specific details are set forth. However, it is understood that embodiments of the invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1:
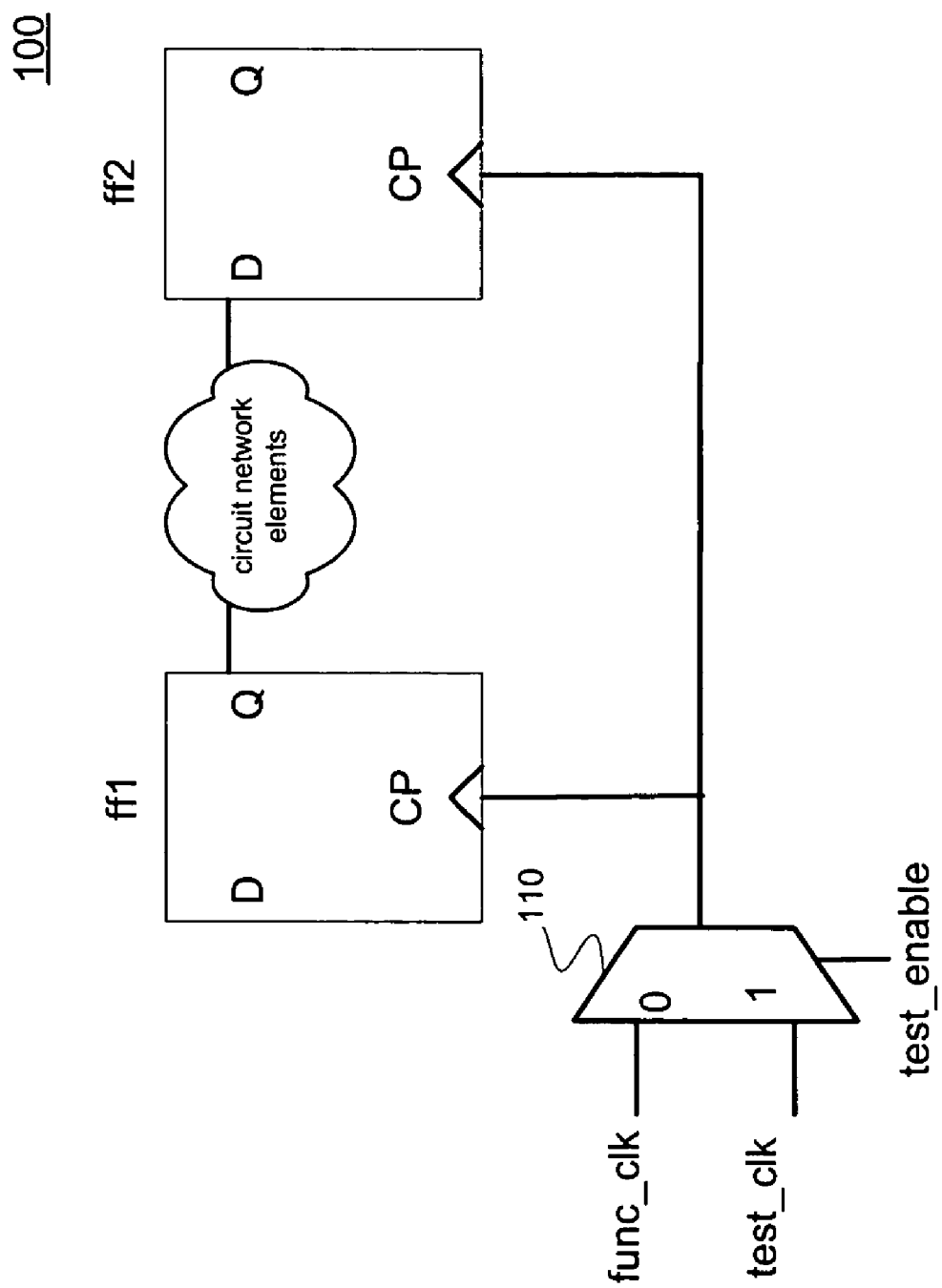
FIG. 1 illustrates an exemplary Multi-Model Clock (MMC) circuit network.
Figure 2:
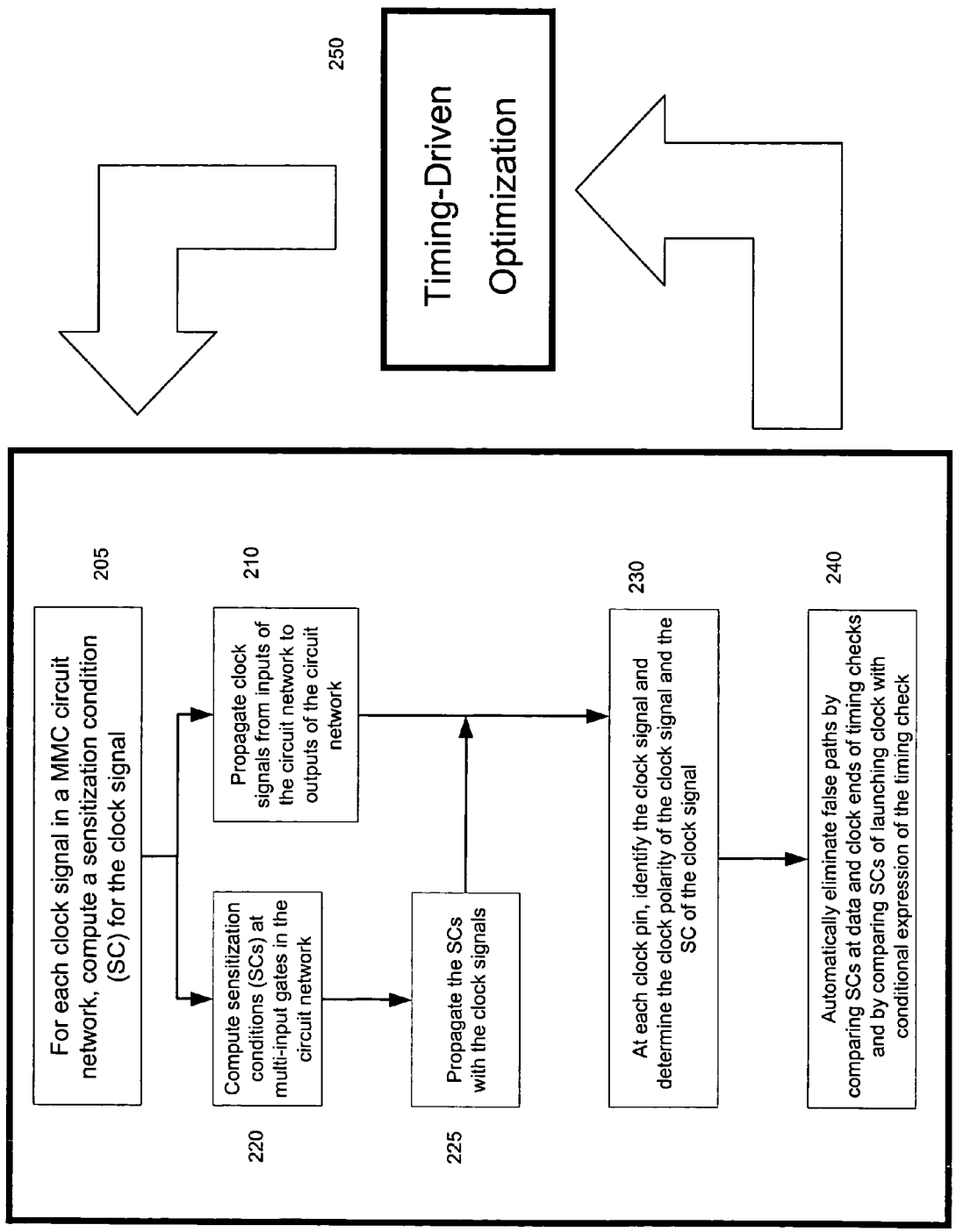
FIG. 2 illustrates a flow diagram of one embodiment of a process to perform static timing analysis and optimization on multi-mode clock designs.

FIG. 2 shows a flow diagram of one embodiment of a process to perform static timing analysis on a MMC circuit network (e.g., the circuit network 100 in FIG. 1). The process is performed by processing logic that may comprise hardware (e.g., circuitry, dedicated logic, etc.), software (such as is run on a general-purpose computer system or a dedicated machine), or a combination of both.

As discussed above, the MMC circuit network includes multiple clocks associated with multiple modes of operation. In the following discussion, examples of MMC circuits providing two modes of operation are described to illustrate the concept. However, one should appreciate that the concept is applicable to MMC circuit having any number (e.g., 3, 4, 5, etc.) of clock signals and any number of modes of operation. In one embodiment, processing logic computes the sensitization condition (SC) of the MMC circuit network to each clock signal (e.g., func_clk and test_clk in FIG. 1) in the MMC circuit network (processing block 205). A sensitization condition (SC) of the MMC circuit network to a clock signal or a polarity of the clock signal is the input logic condition to the MMC circuit network under which the clock signal or the clock parity is active to affect an output of the MMC circuit network. A sensitization condition (SC) of the MMC circuit network to a clock signal may be determined if there exists a gate with two or more inputs in the MMC circuit network. Since some clock signals in the MMC circuit network are mutually exclusive, determining the SCs helps to identify false paths of the MMC circuit network. Processing logic then propagates the clock signals forward from the inputs of the MMC circuit network towards the outputs of the circuit network (processing block 210).

Figure 3:
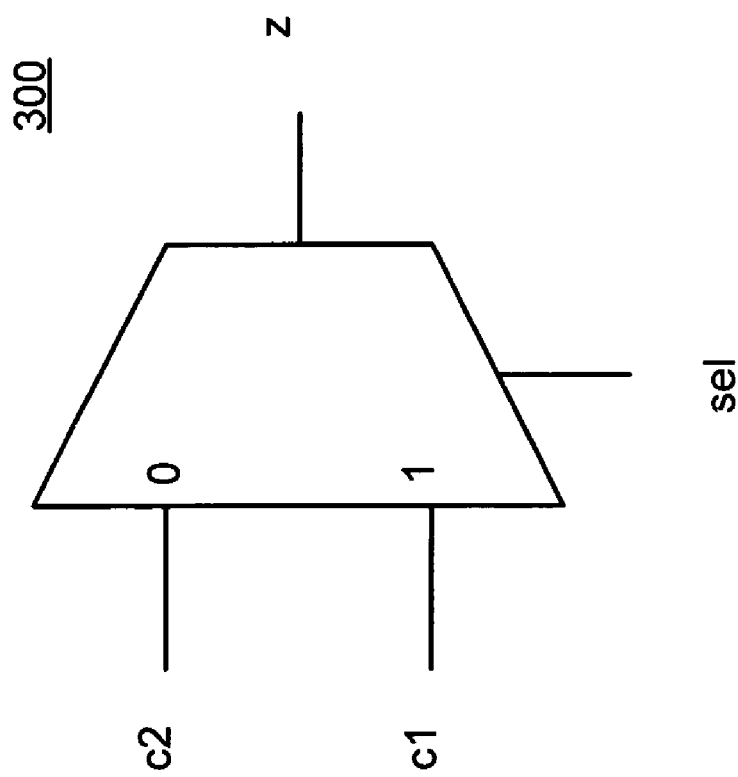
FIG. 3 illustrates an exemplary embodiment of a multiplexer.

In one embodiment, processing logic computes SCs at multi-input gates during the propagation of the clock signals (processing block 220). In one embodiment, for a given multi-input gate (e.g., multiplexer 110 in FIG. 1) on a clock network, a SC may be computed by using the Boolean difference of an output pin (z) with respect to a clock pin (c) of the multi-input gate:

$$\partial z/\partial c = z|c \oplus z|c'$$

where $z|c$ denotes the value of z when c=1 and $z|c'$ denotes the value of z when c=0. For example, consider an exemplary 2-to-1 multiplexer shown in FIG. 3. The 2-to-1 multiplexer 300 has two inputs c1 and c2, a selector sel, and an output z. The logic function of the output z may be expressed as $$z = c1 sel + c2 sel'$$

The SC for c1 is $(sel + c2\ sel') \oplus (c2\ sel') = sel$. Likewise, the SC for c2 is sel'.

Figure 4:
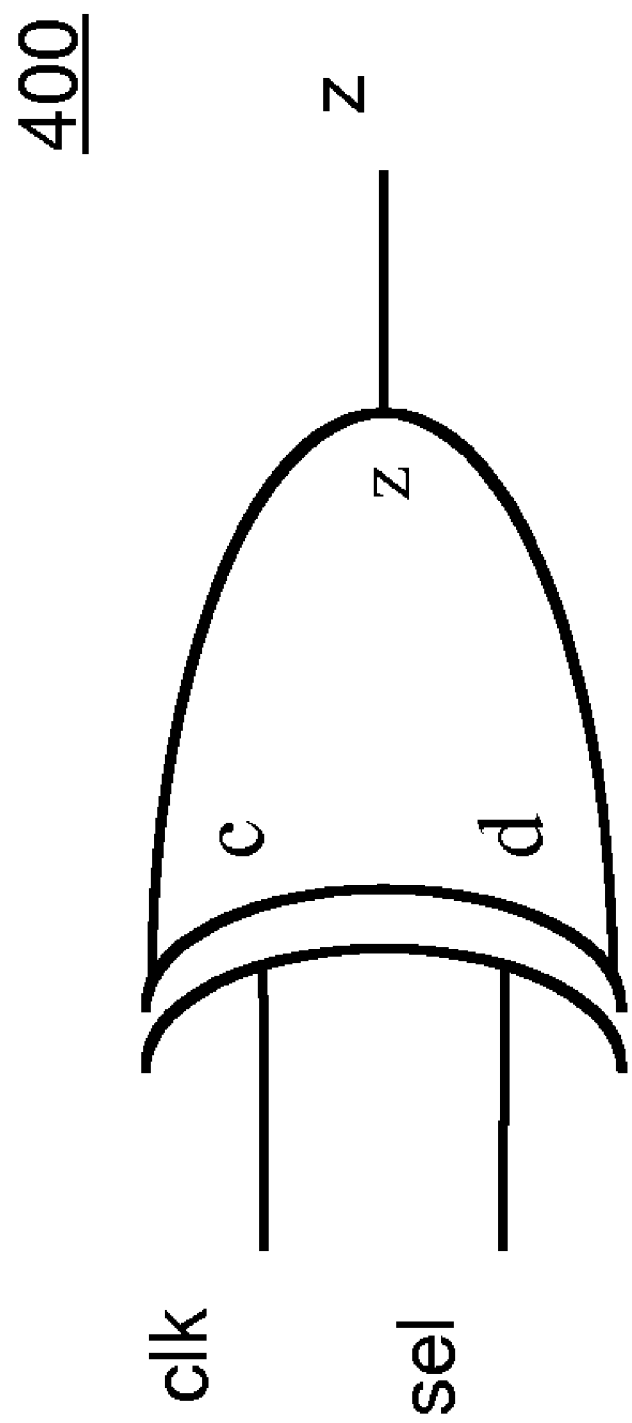
FIG. 4 shows an exemplary XOR gate.

For a non-unate gate, such as the exemplary exclusive-or (XOR) gate 400 shown in FIG. 4, the SC of the circuit network to a clock signal c/k, may evaluate to a tautology of 1, meaning that the clock signal, clk, can propagate through the gate regardless of the value of the select input pin sel. Thus, in some cases involving the non-unate gate, instead of computing a of the circuit network to the clock signal, sensitization conditions (SCs) of the circuit network to the clock polarities of the clock signal are computed by cofactor operations, such as $z|c$ and $z|c'$ where c is the clock signal. For example, consider a 2-input XOR gate with inputs c and d and output z:

$$z = c \oplus d = c'd + cd'$$

The SC for the positive polarity of c is $z|c = d'$ and the SC for the negative polarity of c is $z|c' = d$.

In one embodiment, the SC is represented as a binary decision diagram (BDD) using variables at terminal pins. The terminal pins are pins with zero fanins, such as primary inputs and bi-directional ports. Since the pin functions are already expressed in BDDs, processing logic may recursively compose the BDDs in the relevant fanin cone. In one embodiment, processing logic defines the terminal pins as the pins with multiple fanouts to limit the scope of recursive composition if the BDD composition cannot be completed under a predetermined condition (e.g., within a predetermined period of time or within a predetermined amount of memory).

In another embodiment, processing logic can define a minimal number of pins that completely support the output pins that appear in the BDDs. Such minimum-depth support set of pins can be found by using various approaches, such as the min-cut algorithm or a greedy heuristic approach. This minimum-depth support set can be used to limit the scope of the recursive BDD composition without losing the generality of sensitization condition. In other words, although the scope of the recursive BDD composition is limited in some embodiments, no false paths may be missed.

Processing logic may propagate the SC computed forward along with the clock waveform and polarity information of the clock signals (processing block 225). When there are multiple multi-input devices in the clock network, the SC associated with the device farthest away from the primary input pin is formed by performing conjunction (logical AND) operation with all the SCs in the input path of the device. When the propagation of the clock signals has completed, processing logic can identify the clock signal at the clock pin of each sequential element in the MMC circuit network and determine the clock polarity, as well as the SC, of the clock signal (processing block 230). Using the above information, processing logic automatically eliminates false paths from the clock paths of the circuit network (processing block 240). In one embodiment, processing logic identifies the false paths and ignores the false paths during the static timing analysis run. Based on the static timing analysis results, processing logic may perform timing-driven optimization of the circuit network (block 250). Note that once SCs are computed for the clock network, they do not need to be recomputed even after clock networks are optimized (for example, for useful skews). In some embodiments, processing logic further repeats the static timing analysis and optimization of the circuit network until the timing of the circuit network becomes satisfactory.

The MMC circuit network may include various types of clock paths (e.g., clock-to-clock path and clock-to-data paths) and processing logic may identify false paths accordingly. More detail will be provided below with reference to some examples of clock paths: namely, clock-to-clock paths in a multi-clock circuit network (including clock-to-clock paths in a clock circuit network having a non-unate gate), and clock-to-data paths in a multi-clock circuit network. These examples are given to illustrate the technique disclosed. One should appreciate that the technique disclosed is applicable to other types of circuit networks having more clock signals and more modes of operation.

The first type of clock path includes clock-to-clock paths in a multi-clock circuit network, such as the circuit network shown in FIG. 1. False clock-to-clock paths arise when two mutually exclusive clock paths meet, usually at timing checks. For example, consider the timing checks between ff2/D and ff2/CP in FIG. 1. If the value of test_enable is unknown, four cases of timing checks may come into play as summarized in Table 1 below:

TABLE 1

Different Clock-to-Clock Paths in MMC Design

| Case | Data Signal Launched by | Clock Signal Captured by |
|---|---|---|
| 1 | func_clk | func_clk |
| 2 | func_clk | test_clk |
| 3 | test_clk | func_clk |
| 4 | test_clk | test_clk |

A timing check may be ignored if the SCs between the launching clock and the capturing clock do not intersect. A launching clock is the clock signal that causes a change at the data end of a timing check. A capturing clock is the clock signal that captures a change at the clock end of a timing check. For example consider the circuit illustrated in FIG. 1, the for func_clk is test_enable' and the SC for test_clk is test_enable. Furthermore, test_enable and test_enable' are mutually exclusive. Since the data signal is launched by func_clk and the clock signal is captured by test_clk in case 2, case 2 involves a false path. Likewise, case 3 also involves a false path. Therefore, cases 2 and 3 can be eliminated (block 240 in FIG. 2).

Figure 5:
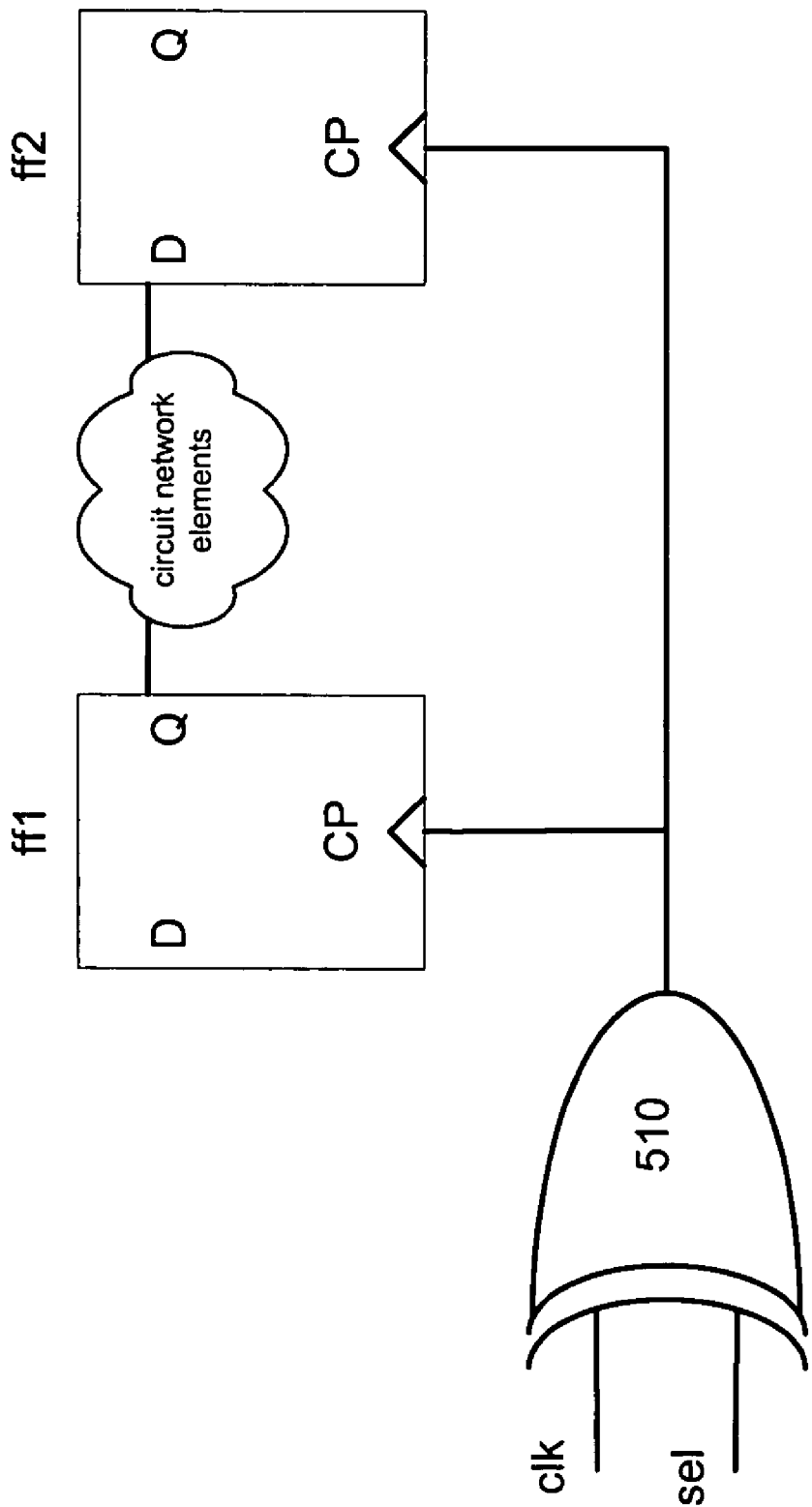
FIG. 5 shows an exemplary clock network with a non-unate gate.

Consider a special type of clock-to-clock paths in a MMC circuit network having a non-unate gate (e.g., an XOR gate). The non-unate gate allows the MMC circuit network to provide different modes of operation using different polarities of the clock signals. For the purpose of illustration, consider an exemplary circuit network having a single clock signal. Mutually exclusive clock conditions may exist even in single-clock circuit networks because of the non-unate gate. An example of a non-unate clock network is shown in FIG. 5. The circuit network 500 includes two flip-flops ff1 and ff2, and an XOR gate 510. The flip-flops ff1 and ff2 are configured in a pipeline fashion in the circuit network 500. A clock signal, clk, and a data signal, sel, are input to the XOR gate 510. The output of the XOR gate 510 is input to the clock pins of ff1 and ff2. If the value of sel signal is not known, there may be four cases of timing checks at the D-input pin of ff2 (i.e., ff2/D) as summarized in Table 2 below:

TABLE 2

Different Clock-to-Clock Paths in Non-Unate Clock Network

| Case | Data Signal Launched by | Clock Signal Captured by |
|---|---|---|
| 1 | Positive polarity of clk | Positive polarity of clk |
| 2 | Positive polarity of clk | Negative polarity of clk |
| 3 | Negative polarity of clk | Positive polarity of clk |
| 4 | Negative polarity of clk | Negative polarity of clk |

However, not all four cases shown above are possible because the positive and negative polarities of the clock signal, clk, are mutually exclusive. Since cases 2 and 3 include both the positive polarity of clk and the negative polarity of clk, cases 2 and 3 are false. Some conventional timing analysis tools try to eliminate false clock-to-clock paths in this kind of non-unate clock network by considering only one polarity of the clock, such as the positive polarity. As a result, these conventional timing analysis tools eliminate case 4 with cases 2 and 3 in the above example because the negative polarity of clk is active in case 4. Note that case 4 does not involve a false path.

In contrast, the current technique uses the SCs for the positive and the negative polarities of clk to eliminate only cases 2 and 3 in the above example. Both cases 1 and 4 remain in the timing analysis under the current approach. The timing results generated from performing a static timing analysis run on both cases 1 and 4 are more reflective of the true temporal behavior of the circuit network 500 because both cases 1 and 4 are possible in a real life implementation of the circuit network 500. Therefore, the current approach enables more accurate timing analysis than the conventional approach.

Figure 6:
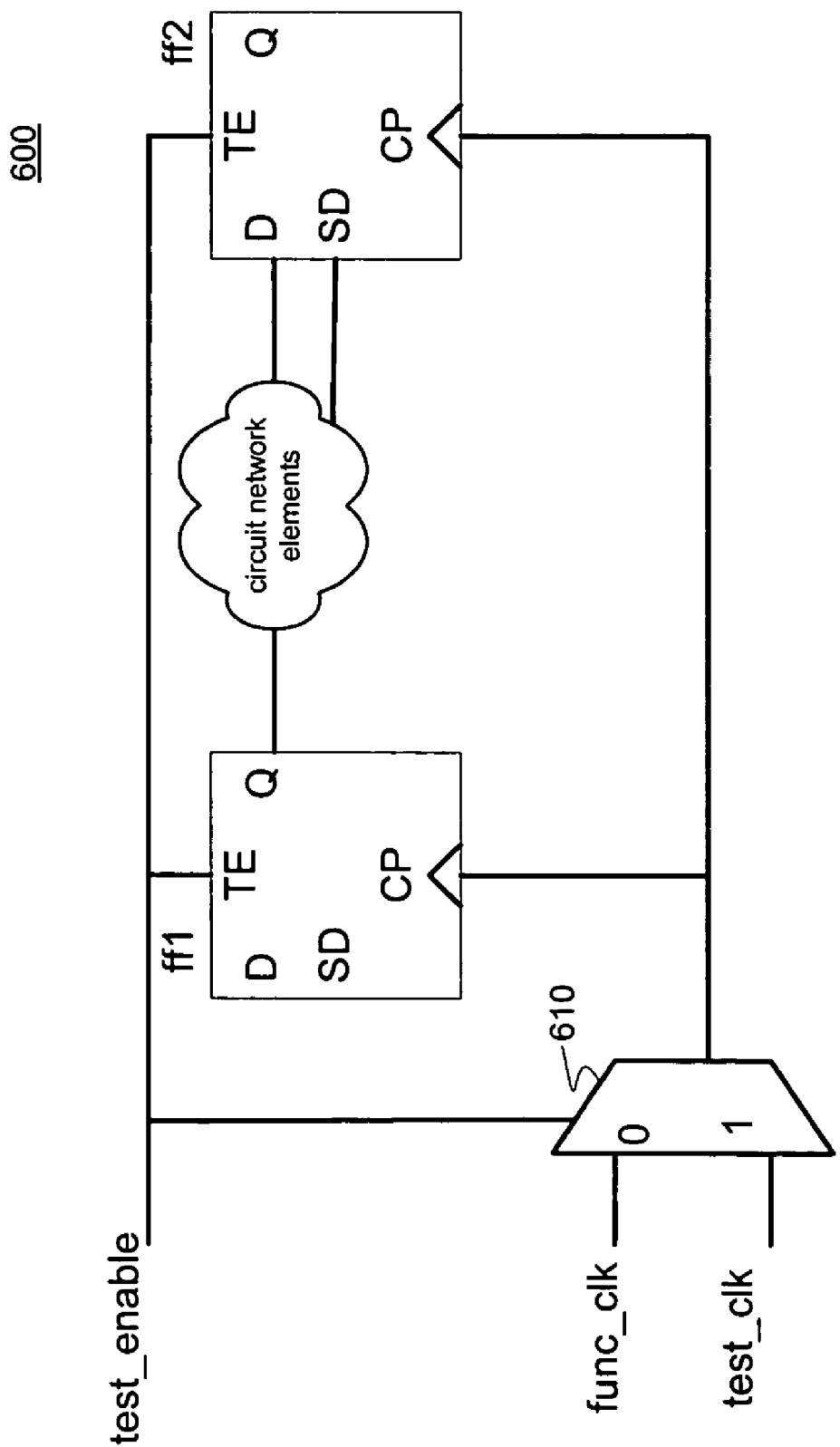
FIG. 6 shows an exemplary MMC circuit network.

Another type of clock path includes clock-to-data paths in a multi-clock circuit network. In some circuit networks, sequential elements may have multiple input pins for different modes. False clock-to-data paths arise when a clock signal of a certain operating mode meets a data signal that belongs to a different operating mode. One exemplary embodiment of a circuit network is shown in FIG. 6. The circuit network 600 includes a MUX 610 and two flip-flops ff1 and ff2. Each of the flip-flops ff1 and ff2 has a data pin D, a scan data pin SD, a test-enable pin (TE), an output pin (Q), and a clock pin (CP). The MUX 610 receives two clock signals, func_clk and test_clk, at its input pins. The MUX 610 further receives a signal, test_enable. When test_enable is 0, the MUX 610 outputs func_clk. Likewise, when test_enable is 1, the MUX 610 outputs test_clk. The output of the MUX 610 is input to the CP of both ff1 and ff2.

The circuit network 600 is in the functional mode when test_enable is 0. The circuit network 600 is in the test mode when test_enable is 1. In the functional mode, both func_clk and the data pin D of both ff1 and ff2 are active while both test_clk and the scan data pin SD are inactive. In the test mode, both test_clk and the scan data pin SD of both ff1 and ff2 are active while both func_clk and the data pin D are inactive. During the analysis of the register-to-register constraints between ff1 and ff2, the following four cases come into play at ff2:

TABLE 3

Different Clock-to-Data Paths in MMC

| Case | Data Signal Launched by | Data Signal Terminated at |
|---|---|---|
| 1 | func_clk | D |
| 2 | func_clk | SD |
| 3 | test_clk | D |
| 4 | test_clk | SD |

Since func_clk and SD cannot be active together in either mode of operation, case 2 is false. Likewise, case 3 is false because test_clk and D cannot be active at the same time in either mode of operation. Therefore, cases 2 and 3 may be eliminated. Again, the SC for clock signals can be used to suppress false paths as in the analysis of clock-to-clock paths discussed above. However, one difference is that additional comparisons for the SC of launching clocks against the conditional expressions of timing checks may be made for clock-to-data paths. These conditional expressions may be represented as BDDs using variables at terminal pins as discussed above. When timing checks are evaluated, a check may be ignored when the SC of the launching clock does not intersect the SC of the capturing clock, or the SC of the launching clock does not intersect the conditional expression for the timing check (block 240 in FIG. 2).

For example, consider again case 3 in Table 3, in which a timing check at the data pin of ff2 (i.e., ff2/D) is caused by a data signal launched by test_clk and a clock signal captured at the CP of ff2 is test_clk. Even though the SCs for the launching clock and the capturing clock match in case 3, the check is nevertheless ignored because the SC (test_enable=1) for the launching clock does not intersect the conditional expression for the timing check (test_enable=0).

In one embodiment, the conditional expressions for timing checks are not specified at the input pins. Processing logic computes the Boolean difference of the output function with respect to the input pins. Processing logic may infer the conditional expressions for timing checks from the Boolean difference computed. For example, assume that the function at the output pin Q is $Q=DTE'+SDTE$ Then the conditional expression for timing checks associated with the pin D will be TE' and the one for the pin SD will be TE.

One advantage of the technique disclosed is that no additional information beyond what the conventional timing engine needs has to be provided. Furthermore, the technique disclosed demands no changes to the optimization and timing analysis flow even in the presence of multi-mode clocks. Such capability significantly enhances the usability of timing tools and improves the timing closure flow because the need for multiple timing runs or manual false path identification is eliminated.

Figure 7:
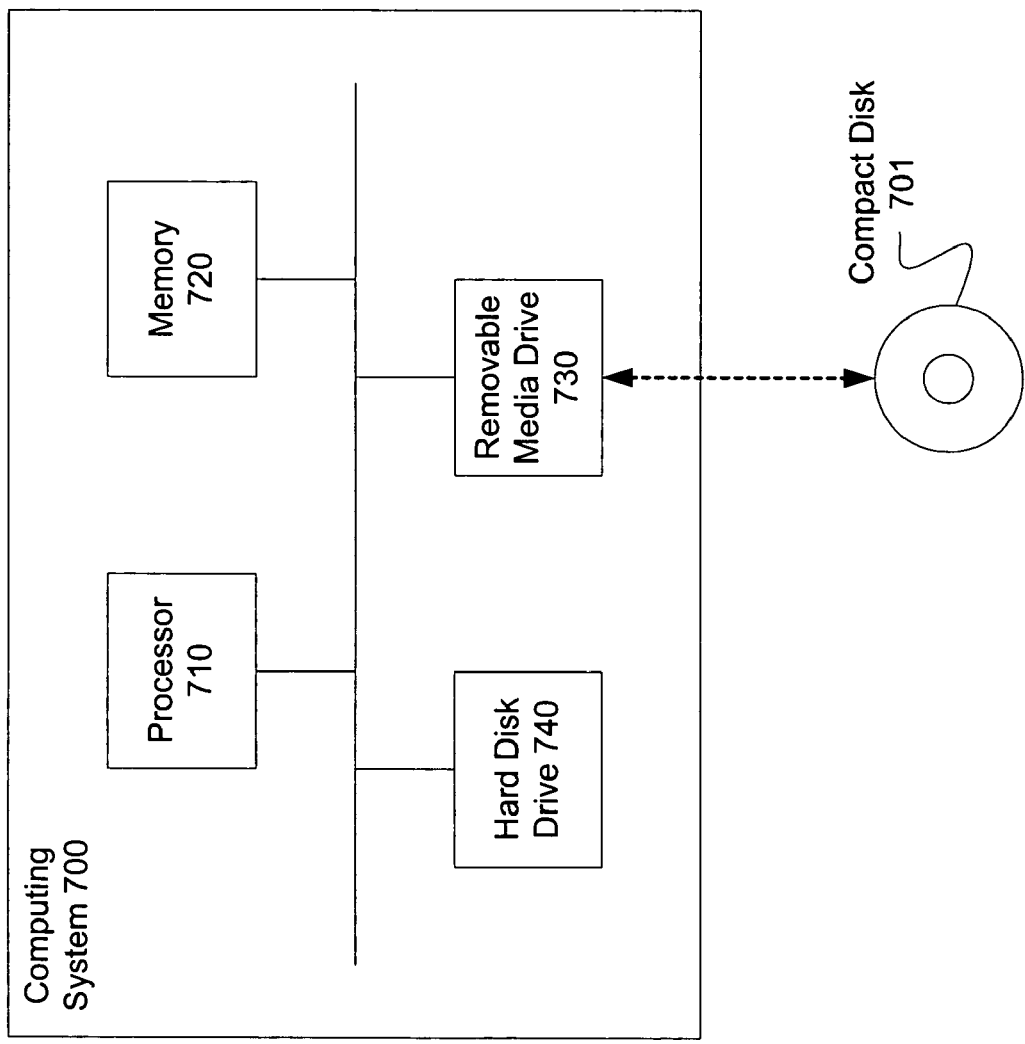
FIG. 7 illustrates one embodiment of a computing system.

FIG. 7 illustrates a computing system that may be used to perform some or all of the processes according to one embodiment of the invention. In one embodiment, the computing system 700 includes a processor 710 and a memory 720, a removable media drive 730, and a hard disk drive 740. Note that various embodiments of the computing system 700 may include more or less components as illustrated in FIG. 7. In one embodiment, the processor 710 executes instructions residing on a machine-readable medium, such as the hard disk drive 740, a movable medium (e.g., a compact disk 701, a magnetic tape, etc.), or a combination of both. The instructions may be loaded from the machine-readable medium into the memory 720, which may include Random Access Memory (RAM), dynamic RAM (DRAM), etc. The processor 710 may retrieve the instructions from the memory 720 and execute the instructions to perform operations described above.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the present invention is not described with reference to any particular programming language. It will be appreciated that a variety of programming languages may be used to implement the teachings of the invention as described herein.

A machine-accessible medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A method comprising:
   automatically determining a plurality of sensitization conditions of a multi-mode clock circuit network to one or more clock signals, wherein the multi-mode clock circuit network is operable in a plurality of modes with a plurality of clock signals and a sensitization condition with respect to a clock signal is an input signal logic condition to the multi-mode clock circuit network under which the respective clock signal is active to affect an output of the multi-mode clock circuit network, wherein at least one sensitization condition of the multi-mode clock circuit network is automatically determined by computing cofactor operations of an output signal of the multi-mode clock circuit network with respect to a polarity of one of the plurality of clock signals, wherein the output signal is represented by a Boolean logic function of one or more input signals of the multi-mode clock circuit network; and
   automatically eliminating false paths from a plurality of clock paths in the multi-mode clock circuit network in response to the plurality of sensitization conditions.

2. The method of claim 1, further comprising:
   performing a single static timing analysis run during timing optimization on the plurality of modes using the one or more clock signals without multiple timing runs for each mode and without manual specification of false paths due to mutually exclusive clock signals.

3. The method of claim 1, wherein
   the automatically determining of the plurality of sensitization conditions includes
      computing a sensitization condition at each of a plurality of inputs at each of one or more multiple-input gates in the multi-mode clock circuit network.

4. The method of claim 1, further comprising:
   propagating the one or more clock signals with the plurality of sensitization conditions from a plurality of inputs of the multi-mode clock circuit network to a plurality of outputs of the multi-mode clock circuit network through a plurality of devices in a clock network.

5. The method of claim 4, further comprising:
   for a clock pin of each of a plurality of sequential elements in the multi-mode clock circuit network,
      identifying a clock signal at the clock pin after propagating the one or more clock signals, and
      determining a clock polarity of the clock signal and a sensitization condition for the clock signal.

6. The method of claim 1, wherein
automatically eliminating the false paths includes
identifying a clock-to-clock path as a false path if a sensitization condition of a launching clock does not intersect a sensitization condition of a capturing clock.

7. The method of claim 1, wherein
the multi-mode clock circuit network includes a clock network having a non-unate gate, which allows the multi-mode clock circuit network to operate in different modes of the plurality of modes in response to different polarities of the one or more clock signals, and
automatically eliminating the false paths includes
identifying a clock-to-clock path as a false path if a sensitization condition of a launching clock of positive or negative polarity does not intersect a sensitization condition of a capturing clock of positive or negative polarity.

8. The method of claim 1, wherein
automatically eliminating the false paths includes
identifying a clock-to-data path as a false path if a sensitization condition of a launching clock does not intersect a conditional expression on a timing check associated with a data signal.

9. The method of claim 1, further comprising:
identifying the false paths using the plurality of sensitization conditions.

10. The method of claim 9, further comprising:
representing the plurality of sensitization conditions using Binary Decision Diagrams (BDDs).

11. The method of claim 9, further comprising:
propagating the one or more clock signals and the sensitization conditions from a plurality of inputs of the multi-mode clock circuit network to a plurality of outputs of the multi-mode clock circuit network through a plurality of devices in a clock network within the multi-mode clock circuit network; and
performing a conjunction of sensitization conditions along a fanin path to determine a sensitization condition at a pin in the clock network.

12. The method of claim 11, wherein
the automatic determining of the plurality of sensitization conditions includes
for a clock pin of each of a plurality of sequential elements in the multi-mode clock circuit network,
identifying a clock signal at the clock pin after propagating the one or more clock signals, and
determining a clock polarity of the clock signal and a sensitization condition for the clock signal.

13. The method of claim 1, wherein
a first mode of the plurality of modes over which the multi-mode clock circuit network is operable is a test mode.

14. The method of claim 13, wherein
a second mode of the plurality of modes over which the multi-mode clock circuit network is operable is a functional mode.

15. The method of claim 14, wherein
the multi-mode clock circuit network is responsive to a test clock signal in the test mode and a functional clock signal in the functional mode.

16. The method of claim 1, wherein
a sensitization condition of a multi-input gate of the multi-mode clock circuit network to a clock signal is automatically determined by
computing a Boolean difference of an output signal of the multi-input gate with respect to the clock signal, wherein the output signal is represented by a Boolean logic function of one or more input signals.

17. The method of claim 1, wherein
the automatically determining of the plurality of sensitization conditions of the multi-mode clock circuit network to one or more clock signals comprises
automatically determining a sensitization condition of the multi-mode clock circuit network to a positive polarity of a clock signal; and
automatically determining a sensitization condition of the multi-mode clock circuit network to a negative polarity of the clock signal.

18. The method of claim 17, wherein
a sensitization condition of a non-unate gate of the multi-mode clock circuit network to a positive polarity of a clock signal is automatically determined by
computing a value of the logic function of an output of the non-unate gate when the clock signal is a logical one; and
a sensitization condition of the non-unate gate of the multi-mode clock circuit network to a negative polarity of the clock signal is automatically determined by
computing a value of the logic function of an output of the non-unate gate when the clock signal is a logical zero.

19. A machine-readable product with instructions to be executed by a processor, the machine readable product comprising:
a machine readable storage device having stored therein
machine readable program code to automatically determine a plurality of sensitization conditions of a multi-mode clock circuit network to one or more clock signals, wherein the multi-mode clock circuit network is operable in a plurality of modes with a plurality of clock signals and a sensitization condition with respect to a clock signal is an input signal condition to the multi-mode clock circuit network under which the respective clock signal is active to affect an output of the multi-mode clock circuit network, wherein at least one sensitization condition of the multi-mode clock circuit network is a sensitization condition to a polarity of one of the plurality of clock signals and the machine readable program code includes
machine readable program code to compute cofactor operations of an output signal of the multi-mode clock circuit network with respect to a polarity of a clock signal, wherein the output signal is represented by a Boolean logic function of one or more input signals of the multi-mode clock circuit network; and
machine readable program code to automatically eliminate false paths from a plurality of clock paths in the multi-mode clock circuit network in response to the plurality of sensitization conditions.

20. The machine-readable product of claim 19, wherein
the machine readable storage device further has stored therein
machine readable program code to perform a single static timing analysis run during timing optimization on the plurality of modes using the one or more clock signals without multiple timing runs for each mode and without manual specification of false paths due to mutually exclusive clock signals.

21. The machine-readable product of claim 19, wherein
the machine readable program code to determine the plurality of sensitization conditions includes machine readable program code to compute a sensitization condition at each of a plurality of inputs of each of one or more multiple-input gates in the multi-mode clock circuit network.

22. The machine-readable product of claim 19, wherein the machine readable storage device further has stored therein
the machine readable program code to propagate the one or more clock signals with the plurality of sensitization conditions from a plurality of inputs of the multi-mode clock circuit network to a plurality of outputs of the circuit network through a plurality of devices in a clock network.

23. The machine-readable product of claim 19, wherein the machine readable storage device further has stored therein
for a clock pin of each of a plurality of sequential elements in the circuit network,
machine readable program code to identify a clock signal at the clock pin after propagating the one or more clock signals, and
machine readable program code to determine a clock polarity of the clock signal and a sensitization condition for the clock signal.

24. The machine-readable product of claim 19, wherein the machine readable program code to automatically eliminate the false paths includes
machine readable program code to identify a clock-to-clock path as a false path if a sensitization condition of a launching clock does not intersect a sensitization condition of a capturing clock.

25. The machine-readable product of claim 19, wherein the multi-mode clock circuit network includes a clock network having a non-unate gate, which allows the multi-mode clock circuit network to operate in different modes of the plurality of modes in response to different polarities of the one or more clock signals, and
the machine readable program code to automatically eliminate the false paths includes
machine readable program code to identify a clock-to-clock path as a false path if a sensitization condition of a launching clock of positive or negative polarity does not intersect a sensitization condition of a capturing clock of positive or negative polarity.

26. The machine-readable product of claim 19, wherein the machine readable program code to automatically eliminate the false paths includes
machine readable program code to identify a clock-to-data path as a false path if a sensitization condition of a launching clock does not intersect a conditional expression on a timing check associated with a data signal.

27. The machine-readable product of claim 19, wherein a first mode of the plurality of modes over which the multi-mode clock circuit network is operable is a test mode responsive to a first clock signal and a second mode of the plurality of modes over which the multi-mode clock circuit network is operable is a functional mode responsive to a second clock signal.

28. The machine-readable product of claim 19, wherein the machine readable program code to determine the plurality of sensitization conditions includes
machine readable program code to compute a Boolean difference of an output signal of the multi-input gate with respect to a clock signal, wherein the output signal is represented by a Boolean logic function of one or more input signals.

29. A system comprising:
a machine-readable storage device to store instructions; and
a processor, coupled to the machine-readable storage device, to retrieve instructions from the machine-readable storage device and, in response to the instructions retrieved, to perform operations including
automatically determining a plurality of sensitization conditions of a multi-mode clock circuit network to one or more clock signals, wherein the circuit network is operable in a plurality of modes with a plurality of clocks and a sensitization condition with respect to a clock signal is an input signal condition to the multi-mode clock circuit network under which the respective clock signal is active to affect an output of the multi-mode clock circuit network, wherein at least one sensitization condition of the multi-mode clock circuit network is automatically determined by computing cofactor operations of an output signal of the multi-mode clock circuit network with respect to a polarity of one of the plurality of clock signals, wherein the output signal is represented by a Boolean logic function of one or more input signals of the multi-mode clock circuit network; and
identifying and automatically eliminating false paths from a plurality of clock paths in the multi-mode clock circuit network using the plurality of sensitization conditions.

30. The system of claim 29, wherein
the operations further include
representing the plurality of sensitization conditions using Binary Decision Diagrams (BDDs).

31. The system of claim 29, wherein
the operations further include
propagating the one or more clock signals and the sensitization conditions from a plurality of inputs of the multi-mode clock circuit network to a plurality of outputs of the multi-mode clock circuit network through a plurality of devices in a clock network; and
performing a conjunction of sensitization conditions along a fanin path to determine a sensitization condition at a pin in the clock network.

32. The system of claim 29, wherein
the automatic determining of the plurality of sensitization conditions includes
for a clock pin of each of a plurality of sequential elements,
identifying a clock signal at the clock pin after propagating the one or more clock signals; and
determining a clock polarity of the clock signal and a sensitization condition for the clock signal.

33. The system of claim 29, wherein
a first mode of the plurality of modes over which the multi-mode clock circuit network is operable is a test mode and the multi-mode clock circuit network is responsive to a test clock signal in the test mode.

34. The system of claim 33, wherein
a second mode of the plurality of modes over which the multi-mode clock circuit network is operable is a functional mode and the multi-mode clock circuit network is responsive to a functional clock signal in the functional mode, the functional clock signal mutually exclusive of the test clock signal.

35. The system of claim 29, wherein
the identifying and automatically eliminating of the false paths includes identifying a clock-to-clock path as a false path if a sensitization condition of the circuit network to a launching clock does not intersect a sensitization condition of the circuit network to a capturing clock.

36. The system of claim 29, wherein
the circuit network includes a clock network having a non-unate gate which allows the circuit network to operate in different modes of the plurality of modes in response to different polarities of the one or more clock signals, and the identifying and automatically eliminating of the false paths includes,
identifying a clock-to-clock path as a false path if a sensitization condition of the circuit network to a launching clock of positive or negative polarity does not intersect a sensitization condition of the circuit network to a capturing clock of positive or negative polarity.

37. The system of claim 29, wherein
the identifying and automatically eliminating of the false paths includes
identifying a clock-to-data path as a false path if a sensitization condition of the circuit network to a launching clock does not intersect a conditional expression on a timing check associated with a data signal.

38. The system of claim 29, wherein
a sensitization condition of a multi-input gate of the multi-mode clock circuit network to a clock signal is automatically determined by
computing a Boolean difference of an output signal of the multi-input gate with respect to the clock signal, wherein the output signal is represented by a Boolean logic function of one or more input signals.

39. A method comprising:
automatically determining at least one sensitization condition of a multi-mode clock circuit network to a plurality of mutually exclusive clock signals, wherein a sensitization condition with respect to a clock signal is an input signal condition to the circuit network under which the respective clock signal is active to affect an output of the circuit network, the multi-mode clock circuit network capable of operating in at least two operational modes, wherein the at least one sensitization condition of the multi-mode clock circuit network is automatically determined by computing cofactor operations of an output signal of the multi-mode clock circuit network with respect to a polarity of one of the plurality of clock signals, wherein the output signal is represented by a Boolean logic function of one or more input signals of the multi-mode clock circuit network;
automatically eliminating at least one false path from a plurality of clock paths in the multi-mode clock circuit network in response to the at least one sensitization condition; and
performing a static timing analysis of the multi-mode clock circuit network over the at least two operational modes.

40. The method of claim 39, wherein
the static timing analysis is substantially simultaneously performed on the multi-mode clock circuit network over the at least two operation modes.

41. The method of claim 39, wherein
the automatically determining of the at least one sensitization condition includes
computing a sensitization condition of one or more multiple-input gates in the multi-mode clock circuit network to the plurality of mutually exclusive clock signals.

42. The method of claim 39, wherein
one of the at least two operational modes of the multi-mode clock circuit network is a test mode responsive to a test clock signal and
another one of the at least two operational modes of the multi-mode clock circuit network is a functional mode responsive to a functional clock signal.

43. The method of claim 39, wherein:
first processing logic determines the at least one sensitization condition of the multi-mode clock circuit network to the plurality of mutually exclusive clock signals;
second processing logic eliminates the at least one false path from the plurality of clock paths in the multi-mode clock circuit network;
third processing logic performs the static timing analysis of the multi-mode clock circuit network over the at least two operational modes; and
the first processing logic, the second processing logic, and the third processing logic are software, hardware, or a combination of software and hardware.

44. The method of claim 39, wherein
a sensitization condition of a multi-input gate of the multi-mode clock circuit network to a clock signal is automatically determined by
computing a Boolean difference of an output signal of the multi-input gate with respect to the clock signal, wherein the output signal is represented by a Boolean logic function of one or more input signals.

* * * * *